United States Patent [19]

Hanson et al.

[11] 4,040,039
[45] Aug. 2, 1977

[54] SINGLE WALL DOMAIN LATRIX FOR OPTICAL DATA PROCESSING SYSTEM

[75] Inventors: Marlin M. Hanson, Cologne; Ernest J. Torok, St. Paul, both of Minn.

[73] Assignee: Sperry Rand Corporation, New York, N.Y.

[21] Appl. No.: 603,891

[22] Filed: Aug. 11, 1975

[51] Int. Cl.² ............................................. G11C 11/02
[52] U.S. Cl. ....................... 340/174 YC; 340/174 TF
[58] Field of Search ...... 340/174 YC, 174 S, 174 TF; 350/160 R

[56] References Cited

U.S. PATENT DOCUMENTS

| | | | |
|---|---|---|---|
| 3,513,452 | 5/1970 | Bobeck et al. | 340/174 TF |
| 3,706,080 | 12/1972 | Lee | 340/174 YC |
| 3,787,825 | 1/1974 | De Jonge | 340/174 YC |
| 3,836,895 | 9/1974 | De Jonge | 340/174 TF |

*Primary Examiner*—Marshall M. Curtis
*Attorney, Agent, or Firm*—Kenneth T. Grace; Thomas J. Nikolai; Marshall M. Truex

[57] ABSTRACT

A light accessable transistor matrix (latrix) that utilizes an optical page composer having single wall domains, i.e., bubbles, in a layer of magnetizable material as the optical shutter or light valve is disclosed. The latrix is configured into an holographic memory system. The optical page composer is comprised of a magnetizable layer having orthogonal sets of D parallel digit lines and W parallel word lines, the DW intersections of which form DW memory areas. Each memory area has four quadrants defined by the intersecting digit line and word line. An opaque shield is oriented in each memory area for optically shielding a bubble except when in the exposed first quadrant within the memory area. Coincident current selection, e.g., concurrent half current selection, of one digit line and of one word line by half-select write signals permits the one fully selected memory area to be separately selected for the write operation. Full current selection of one word line permits the read operation to concurrently read all memory areas along the one fully selected word line. Optical read out of the stored data along a selected word line by a one-dimensional photosensor array is accomplished by a selective positioning of the associated bubbles in either the first or the fourth quadrant of the associated memory areas corresponding to the readout of a stored 1 or a stored 0.

3 Claims, 13 Drawing Figures

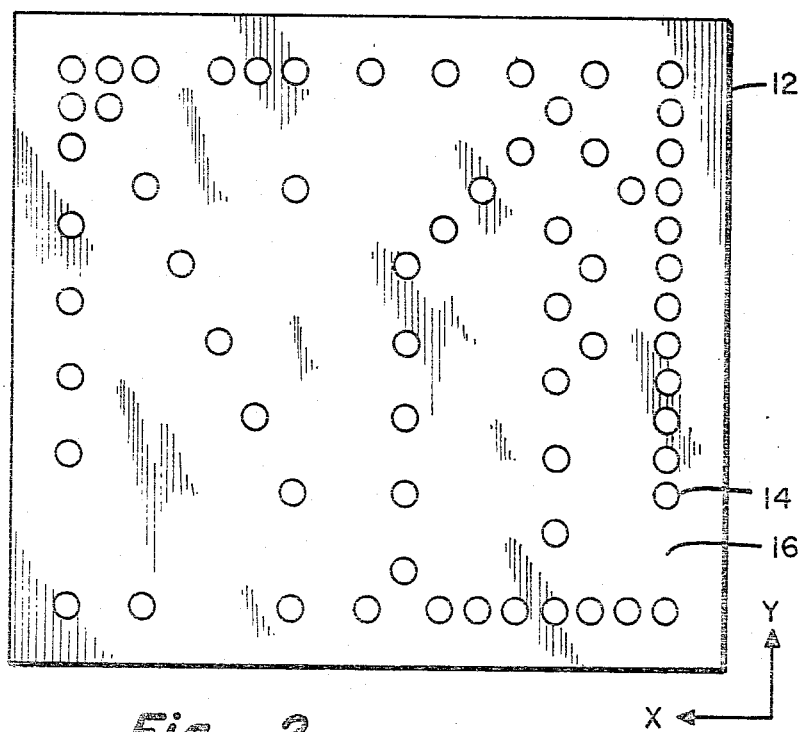
_Fig. 2_
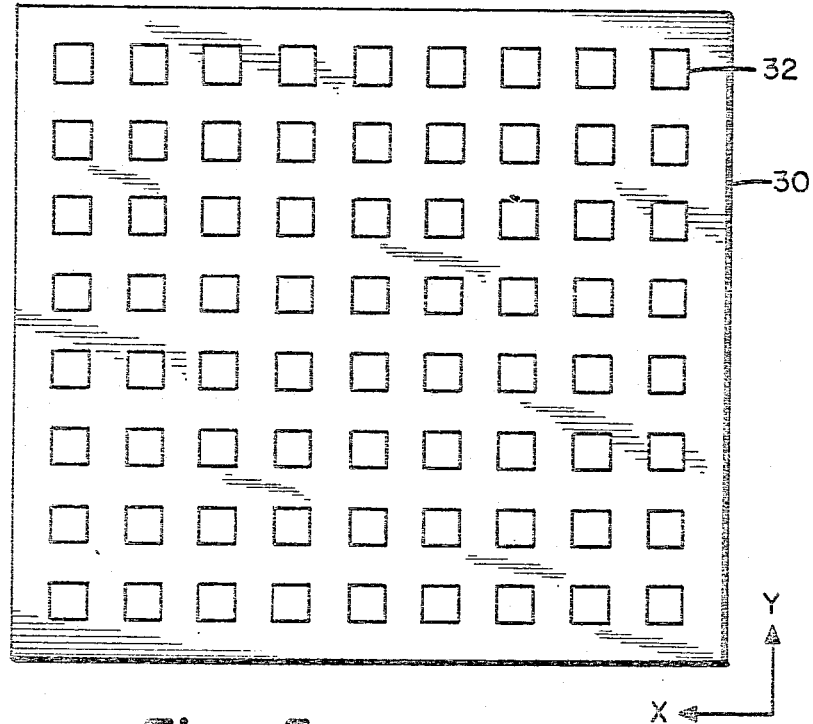
_Fig. 5_

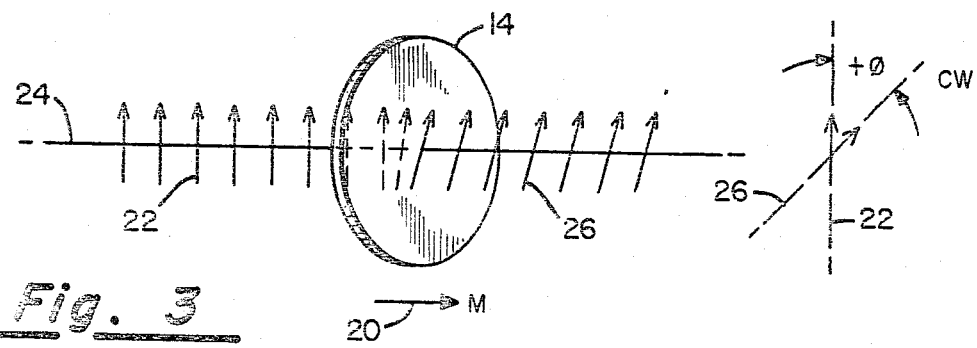
_Fig. 3_
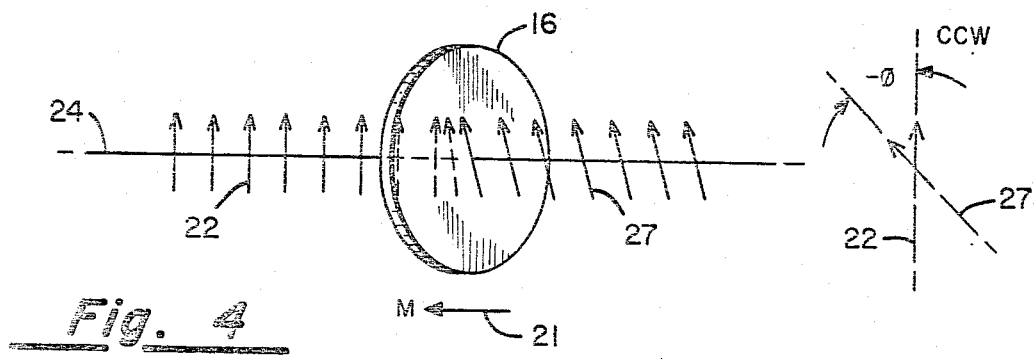
_Fig. 4_
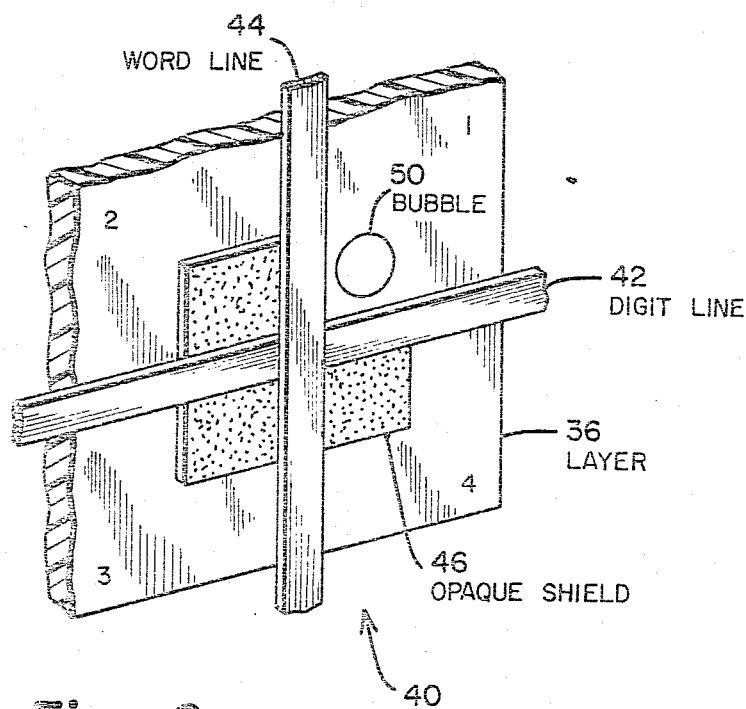
_Fig. 6_

STABLE POSITION OF BUBBLE

STABLE POSITION OF BUBBLE WHEN FIELD IS REVERSED

EXPERIMENTAL POSITION OF EDGE OF BUBBLE FROM A 1 MIL DEPOSITED-ETCHED STRIPLINE AS A FUNCTION OF STRIPLINE CURRENT. TWENTY USEC PULSES WERE USED.

SINGLE WALL DOMAIN LATRIX FOR OPTICAL DATA PROCESSING SYSTEM

BACKGROUND OF THE INVENTION

An optical page composer is a matrix or array of cells, each cell acting as a light valve which passes light vel non according to the binary state of the cell. The page composer is best used in an holographic memory system. For writing into the storage medium or memory, a coherent light beam from a laser impinging on the page composer emerges in a moldulated pattern as an object beam carrying an optical equivalent of the information that is stored in the page composer. This object beam is caused to interfere with a write reference beam at some location of the storage medium, e.g., thermoplastic film, where the information is stored in holographic form as a single page of information.

The information that is stored in each page of the storage medium can be read out from the memory system by illuminating the page in the storage medium by a read reference beam. If the direction of the read reference beam is conjugate to that of the coherent light beam, i.e., the write reference beam, a real image will be formed on the page composer or a symmetrical position on either side of the storage medium by reflective diffraction. An array of photosensors, an array of memory storage cells and an array of light valves, i.e., the page composer, can be superimposed to form a latrix (light accessable transistor matrix - see the publication "Promise of Optical Memories," J. A. Rajchman, JAP, Volume 41, No. 3, Mar. 1, 1970, pp. 1376-1383). The latrix is then a main memory whose contents may be manipulated by a central processor; when additional storage of data or data is required, the contents of the latrix may be "photographed" instantly into a holographic record for storage in the storage medium and new information may then be brought into the latrix. See the D. S. Lo, et al, U.S. Pat. No. 3,761,155 for an holographic memory system incorporating an electrically alterable page composer utilizing bubbles as the light valves.

SUMMARY OF THE INVENTION

The optical page composer of the present invention is comprised of a magnetizable layer in which single wall domains or bubbles may be sustained and moved about and to which are inductively coupled a digit line and a perpendicular word line, the intersection of which forms four quadrants that define or are defined by a memory area in the layer. An opaque shield is oriented in the memory area for optically shielding a bubble except when in the first quadrant within the memory area. Coincident current selection, e.g., concurrent half current selection, of a digit line and of a word line by half select write signals of the proper polarities permits the one fully selected memory area to be fully selected for the selective writing of a 1 or of a 0 therein while the full current selection of one word line permits the read operation to concurrently read out all memory areas along the one fully selected word line.

The optical page composer is preferably comprised of a magnetizable layer having orthogonal sets of D parallel digit lines and W parallel word lines, each intersection of which forms four quadrants that define or are defined by an associated memory area with an opaque shield oriented in three of the four quadrants of each memory area. Coincident current selection of the digit lines and of the word lines by half select write signals of a first polarity for the writing of a 1 and of a second and opposite polarity for the writing of a 0 permits each separate one of the memory areas to be separately selected for the selective positioning of the associated bubble in either the first quadrant (write 1) or the third quadrant (write 0) of the associated memory area without substantially affecting the bubbles in the half-selected memory areas along the half-selected digit line and word line. A full current selection of the one word line by a full select store signal then positions or transfers the bubbles in the fully selected memory areas along the one fully selected word line from the write 1 first quadrant and the write 0 third quadrant into the store 1 second quadrant and the store 0 third quadrant, respectively.

For the read operation, full current selection of one word line by a full select read signal then positions or transfers the bubbles from the store 1 second quadrant and the store 0 third quadrant into the read 1 first quadrant and the read 0 fourth quadrant, respectively. After concurrent readout of the data or information stored in the D memory areas along the one fully selected word line, that one word line is again fully selected by a full select restore signal of the same polarity as the full select store signal but of opposite polarity to the full select read signal. This two-dimensional page composer is then combined with a one-dimensional array of photosensors and a storage medium configured in a two-dimensional array of memory cells to form a latrix or an optical memory system. The use of a one-dimensional array of D photosensors are compared to the prior art use of a two-dimensional array of DW photosensors provides a substantial savings in photosensors and the associated electronics and controls therefor.

The page composer of the present invention is utilized in a holographic memory system to perform three functions, to:

A. Compose data for subsequent storage in the two-dimensional storage medium, i.e., a page composer.
B. Read out data stored in the two-dimensional storage medium, i.e., a light valve to pass only selected light from the two-dimensional storage medium to the one-dimensional array of photosensors.
C. Read out data stored in the page composer, i.e., an electrically alterably two-dimensional memory plane.

BRIEF DESCRIPTION OF THE DRAWINGS

FIG. 2 is an illustration of a layer of magnetizable material included in the page composer of the present invention.

FIG. 3 is an illustration of the Faraday effect rotation upon an incident laser beam by the second magnetization vector direction of a selectively switched single wall domain or bubble in the layer of FIG. 2.

FIG. 4 is an illustration of the Faraday effect rotation upon an incident laser beam by the first magnetization vector direction of the layer of FIG. 2.

FIG. 5 is a illustration of an holographic storage medium in which a plurality of holograms are stored as pages.

FIG. 6 is a perspective view of one memory area of the page composer of the present invention.

DESCRIPTION OF THE PREFERRED EMBODIMENTS

Figure 1:
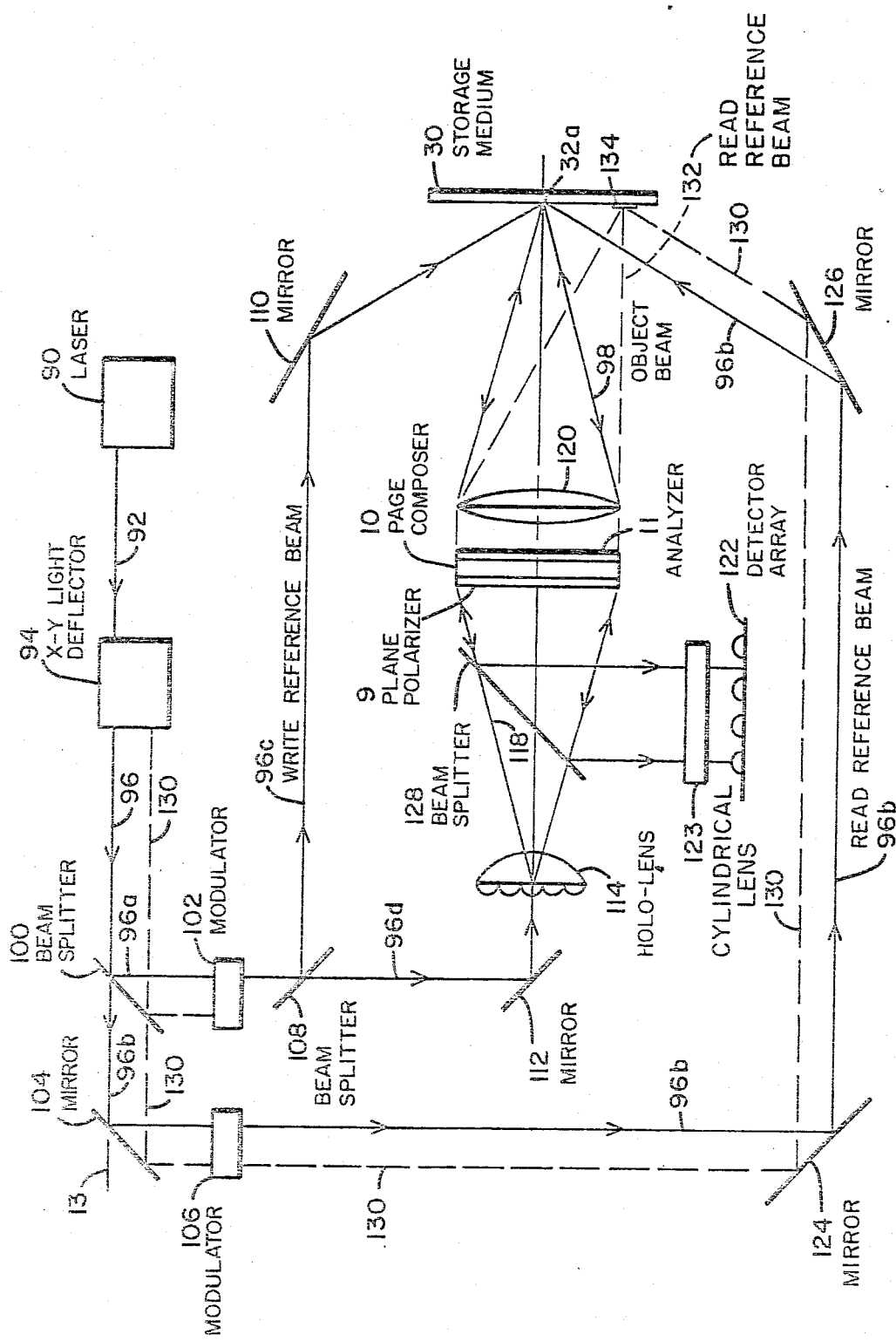
FIG. 1 is a conceptual schematic drawing of an holographic memory system incorporating the present invention.

With particular reference to FIG. 1 there is presented a conceptual implementation of an holographic memory system incorporating the page composer 10 of the present invention. Prior to a detailed discussion of the operation of the holographic memory system of FIG. 1 and page composer 10 of the present invention, it may be best to review the theory of operation of an electrically alterable page composer using, e.g., a platelet or thin layer of magnetizable material of orthoferrite, hexagonal ferrities or garnets as the page composer medium, all as previously discussed in the above mentioned D. S. Lo, et al, U.S. Pat. No. 3,761,155.

With particular reference to FIG. 2 there is presented an illustration of a page composer depicting only the planar platelet or layer 12 of the magnetizable material in which a plurality of single wall domains or bubbles 14, having a magnetization vector M directed vertically, e.g., out of the paper, are established in a two-dimensional array along orthogonal X, Y axes by drive conductors and controls not illustrated - see the article "A New Approach to Memory and Logic-Cylindrical Domain Device," A. H. Bobeck, et al, Proceedings of the Fall Joint Computer Conference, 1969, pp. 489-498. The magnetization vector M of the layer 12 is initially uniformly magnetically oriented in a first magnetization direction normal to its planar surface, e.g., directed downward into the paper, with the magnetization of the selectively written bubbles 14 magnetically oriented in a second magnetization directed opposite to the first magnetization direction, e.g., directed vertically upward out of the paper. Thus, selected portions 14 of the magnetizable material of layer 12 are switched in a second magnetization direction directed vertically upward out of the paper while the remaining portion 16 of the magnetizable material remains in its initial first magnetization direction directed vertically downward into the paper.

With particular reference to FIG. 3 there is presented a schematic illustration of the Faraday effect rotation by the magnetization direction 20 of the magnetization vector M of a bubble 14 of layer 12, upon an incident object beam that is plane polarized along polarization axis 22 by plane polarizer 9 of FIG. 1. The object beam is directed incident to the planar surface of a bubble 14 of layer 12 along a transmission axis 24 which is normal to the planar surface of bubble 14. As the object beam passes through bubble 14 it undergoes a Faraday effect clockwise rotation through an angle $+\phi$ being rotated clockwise from the first plane polarization axis 22 into the second plane polarization axis 26.

With particular reference FIG. 4 there is presented a schematic illustration of the Faraday effect rotation, by the magnetization direction 21 of the magnetization vector M of the portion 16 of layer 12, which is that portion of layer 12 not including bubbles 14, upon an incident object beam that is plane polarized along polarization axis 22 by plane polarizer 9 of FIG. 1. The object beam is directed incident to the planar surface of portion 16 of layer 12 along a transmission axis 24 which is normal to the planar surface of portion 16. As the object beam passes through portion 16 it undergoes a Faraday effect counterclockwise rotation through an angle $-\phi$ being rotated counterclockwise from the first plane polarization axis 22 into the third plane polarization axis 27.

With particular reference to FIG. 5 there is presented a schematic illustration of an holographic storage medium 30 in which there are stored a plurality of pages 32 organized along orthogonal X, Y areas. Each of the pages 32 is an hologram of the data held in the respectively associated page of layer 12 as composed by page composer 10 of FIG. 1, which data are stored therein by the conjoint action of object beam 98 and write reference beam 96c - see FIG. 1. Write reference beam 96c and object beam 98 are digitally controlled by light deflector 94 to electrically access, by the proper optical focusing, any one of the XY pages 32 that are stored within holographic storage medium 30.

With particular reference to FIG. 6 there is presented an isometric view of one memory area 40 in the page composer 10 of the present invention. Layer 36 is a planar layer of magnetizable material in which single wall domains or bubbles 50 may be sustained and moved about while subjected to a bias field $H_B$ that is directed normal to the plane of layer 36. Superposed layer 36 and parallel to the plane thereof are digit line 42 and word line 44 oriented perpendicular to each other for forming the memory area 40 having the four quadrants 1, 2, 3, 4 that are defined by the intersecting digit line 42 and word line 44. Oriented within the memory area 40 defined by the intersecting digit line 42 and word line 44 is an opaque shield 46 that is oriented in the second, third and fourth quadrants but not in the first quadrant of the memory area 40.

Figure 7A:
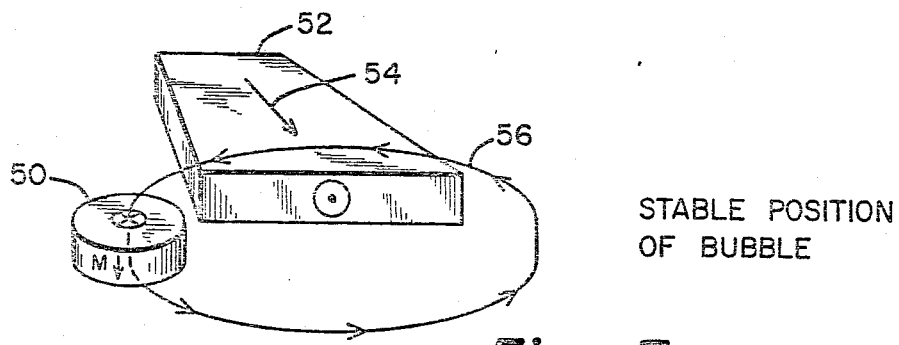
FIG. 7a and 7b are illustrations of the stable positions of a bubble about a strip-line when affected by a magnetic field generated by a current flowing therethrough.
Figure 7B:
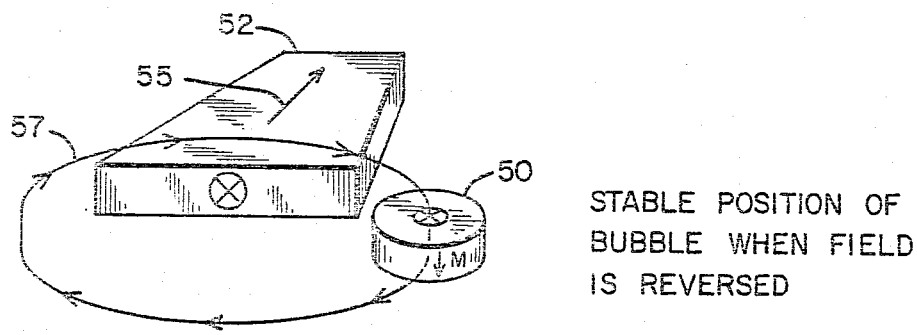

With particular reference to FIGS. 7a and 7b the theory of operation of the memory area 40 of FIG. 6 will now be explained. This operation is based upon the principle that a bubble 50 can be moved by the gradient of a magnet field that is directed normal to the planar surface of the magnetizable layer, while the bubble 50 moves toward that point in the magnetizable layer where that normal field is of the greatest intensity and is in the direction of the magnetization within the bubble. FIG. 7a illustrates the condition when a current signal is coupled to a strip-line 52 so as to flow in the direction denoted by vector 54 generating the associated counterclockwise magntic field denoted by circumferential vector 56. As the field normal to the magnetizable layer is of the greatest intensity just outside the edge of the strip-line 52, the bubble 50 will nestle immediately adjacent to the strip-line 52. Conversely, when the current flowing in strip-line 52 is reversed so as to flow in the direction denoted by vector 55 generating the associated clockwise magnetic field denoted by circumerential vector 57, as illustrated in FIG. 7b, the stable position of the bubble 50 is on the opposite side of the strip-line 52. Thus, the bubble 50 can be shifted back and forth between the two stable positions along the opposing edges of the strip-line 52 by reversing the direction of current flow in the strip-line 52. Since there is a coercevity associated with the bubble 50, as with all magnetic domains, the bubble 50 remains in either of these two stable positions after the termination of the current flow in the strip-line 52.

Figure 8:
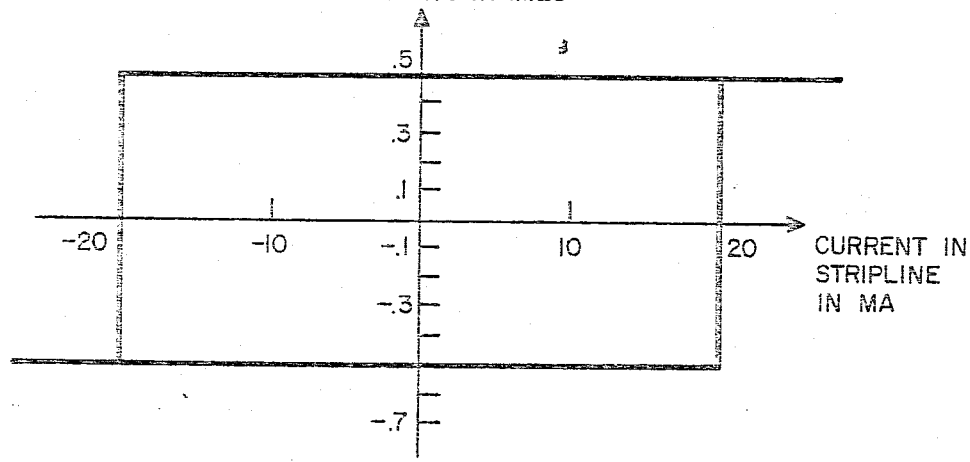
FIG. 8 is a graph of the stable positions of a bubble with respect to a strip-line as a function of the amplitude of the current flowing through the strip-line.
Figure 11:
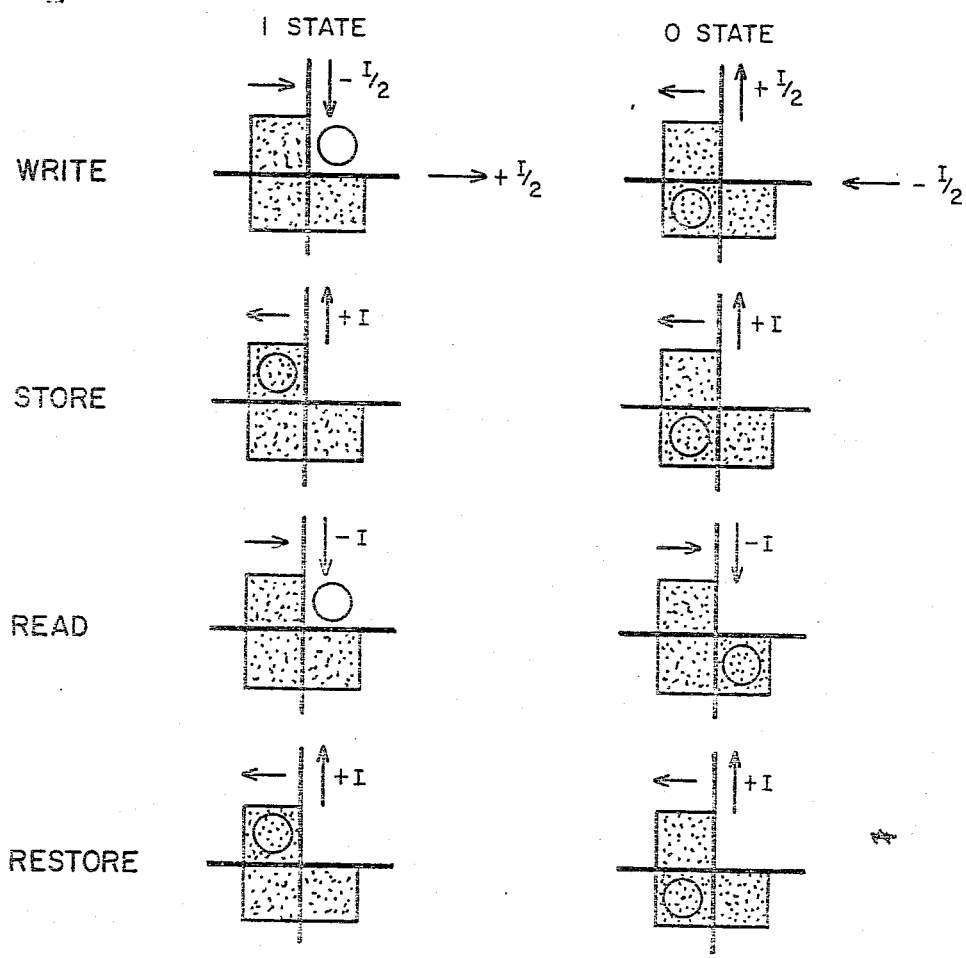
FIG. 11 are illustrations of the stable positions of a bubble within the memory area of FIG. 6 when subjected to the selection current signals of FIG. 10.

With particular reference to FIG. 8 there is illustrated a graph of experimental data obtained when a bubble 50 was shifted back and forth across strip-line 52 with 20 microsecond ($\mu$sec) pulses. The illustrated data shows that the stable position of the bubble 50 along the strip-line 52 is a function of the amplitude of the strip-line current. The square hysteresis loop indicates that the bubble 50 can be used as a coincident current memory element. When a half-select current, e.g., of 10 milliamps (mA) is supplied to a word line, e.g., word line 44 of FIG. 6, but not to the digit line, e.g., digit ling 42 of FIG. 6, the bubble 50 is not moved. Also, when a half-select current is applied to the digit line but not to the word line, bubble 50 is not moved. However, when half-select currents are simultaneously applied to both the word line 44 and the digit line 42, the bubble 50, in the memory area 40 defined by the energized intersecting word line 44 and digit line 42, is moved from the upper right-hand corner, i.e., quadrant 1, to the lower lefthand corner, i.e., quadrant 3, or vice versa. In the upper lefthand corner, i.e., quadrant 2, the lower lefthand corner, i.e., quadrant 3, and the lower righthand corner, i.e., quadrant 4, bubble 50 is superposed a shield 46 of deposited opaque material such that bubble 50 is, accordingly, effectively not visible to light that is incident to the plane of layer 36. Thus, when bubble 50 is positioned in quadrant 3 and optically shielded by opaque shield 46 it is considered to define a write 0 state while, conversely, when bubble 50 is in quadrant 1 and is not covered or shielded by opaque shield 46 it is considered to define a write 1 state - see FIG. 11.

PAGE COMPOSER OPERATION

Figure 9:
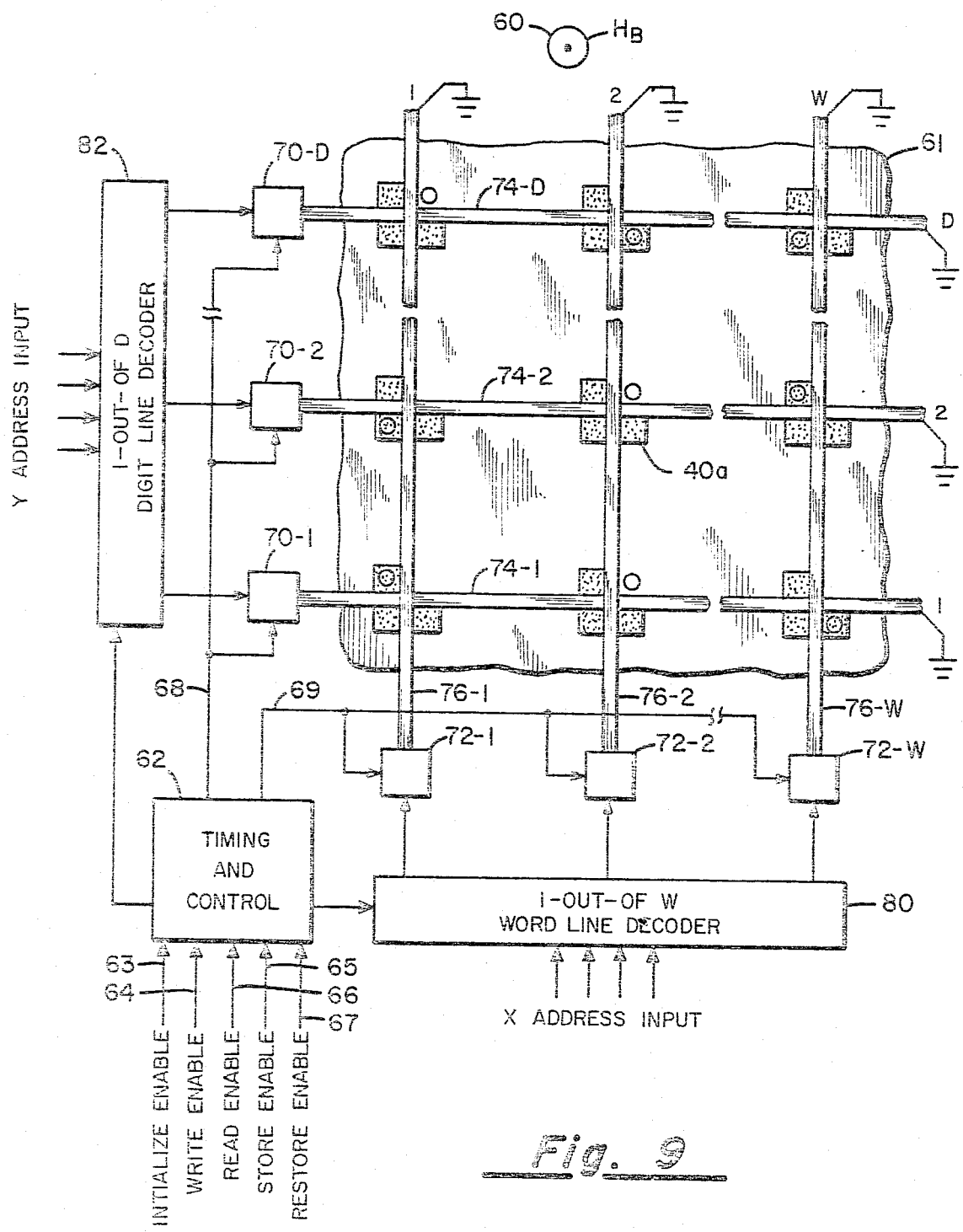
FIG. 9 is a schematic illustration of a bubble memory system for positioning bubbles within the memory areas of the page composer of the present invention.
Figure 10:
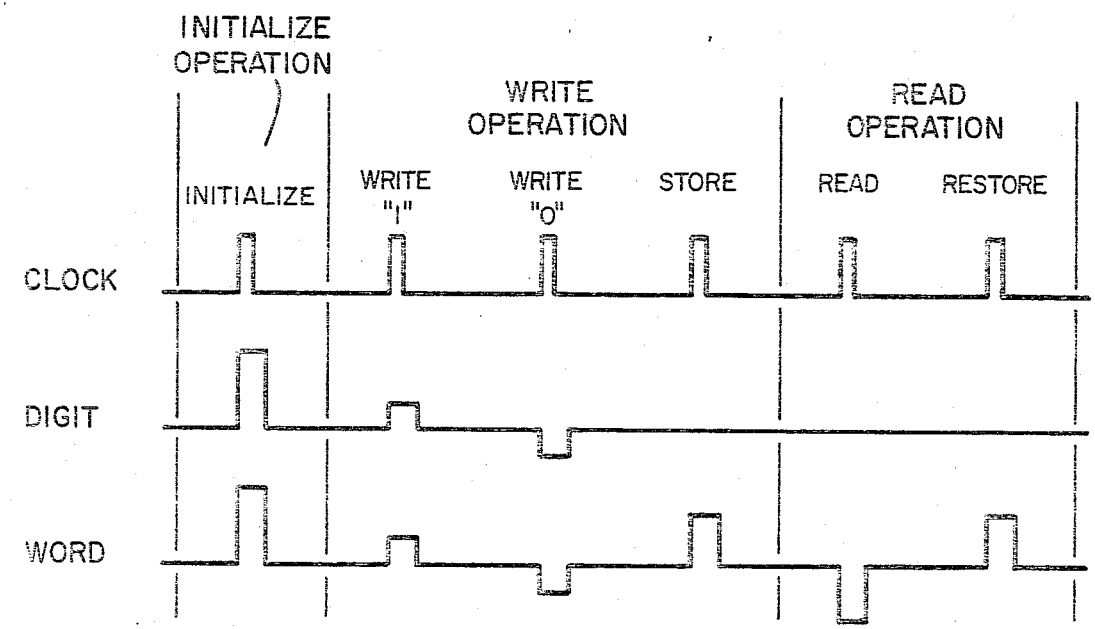
FIG. 10 is an illustration of a timing diagram employed by the bubble memory system of FIG. 9.

With particular reference to FIG. 9 there is presented a schematic diagram of a bubble memory system incorporating the present invention in which, for a write operation, a selected one of the bubbles 50 at the DW intersections of the D digit lines and the W word lines is selectively affected by half-select write digit and word drive currents to be positioned in the first quadrant - see FIG. 6 - representative of the storage of a 1 or in the third quadrant representative of the storage of a 0. Then, the associated word line is affected by a full select store signal whereby the bubble 50 if in the write 1 first quadrant is transferred into the stored 1 second quadrant while if in the write 0 third quadrant is maintained in the stored 0 third quadrant. See FIGS. 10 and 11 for the related signal timing diagram and the associated stable positions of bubble 50. Provided is a bias field $H_B$, as represented by the circle 60, which implies a field directed upwardly normal to the plane of the layer 61 of the magnetizable material in which single wall domains or bubbles 50 may be sustained and moved about - such bias field $H_B$ may be provided by a configuration of Helmholtz coils such as illustrated in the A. H. Bobeck U.S. Pat. No. 3,534,347.

INITIALIZE OPERATION

Initially, a bubble 50 may be generated at each digit line, word line intersection by an initialize enable signal on line 63 enabling timing and control circuitry 62, via lines 68, 69, to energize the digit drivers 70-1, 70-2, 70-D and the word line drivers 72-1, 72-2, 72-W and couple the appropriate initialize current signal amplitude of approximately 1.5 a full select current signal to their associated digit lines 74-1, 74-2, 74-D and the associated word lines 76-1, 76-2, 76-W, respectively.

WRITE OPERATION

With a bubble 50 now positioned at each digit line, word line intersection by the initialize operation, the bubble 50 at each memory area 40 may be selectively written in the 1 state, denoted by the bubble 50 being positioned in the exposed upper righthand quadrant 1 or alternatively written into the 0 state, denoted by bubble 50 being positioned in the lower lefthand quadrant 3 and superposed the opaque layer 46. This write 1, write 0 operation is typical of all coincident current, i.e., bit select, memory operation. Firstly, the X address input data is coupled to one-out-of-W word line decoder 80 which energizes one of the W output lines that are associated with word line drivers 72-1, 72-2, 72-W. Concurrently, the Y address input data is coupled to the one-out-of-D digit line decoder 82 which energizes one of the D output lines that are associated with one of the digit line drivers 70-1, 70-2, 70-D. Concurrently with the energizing of the one selected word line driver, e.g., word line driver 72-2 and the one selected digit line driver, e.g., digit line driver 70-2, a write enable signal on line 64 causes timing and control 66 to couple the appropriate polarity write 1 or write 0 half-select signal to the corresponding lines 68, 69 such that the one energized word line driver 72-2 and the one energized digit line driver 70-2 each couple their associated one-half select current signal of the proper polarity to their associated select word line 76-2 and digit line 74-2.

As an example, with the word line and digit line superposed above the layer 61 and using the well-known righthand rule, if the memory area 40a at the intersection of word line 76-2 and digit line 74-2 is to be written into a 1 state, word line driver 72-2 must couple a negative half-select current pulse to its associated word line 76-2 while, concurrently, digit line driver 70-2 must couple a positive half-select current pulse to its associated digit line 74-2. Correspondingly, it is apparent that if such memory area 40a is to be written into a 0 state, word line driver 72-2 must couple a positive half-select current pulse to its associated word line 76-2 while digit line driver 70-2 must couple a negative half-select current pulse to its associated digit line 74-2.

Observing the same rules, it can be seen that any one of the memory areas 40 at any of the digit line 74, word line 76 intersections may be selectively affected by the concurrent effect of the coincident half-select word line and digit line drive currents. This coincident current operation is based upon the fact that each of the digit line half-select current signals and each of the word line half-select current signals are individually of insufficient amplitude to substantially affect the position of the bubbles 50 at the associated memory areas 40 but that the digit line half-select current and the word line half-select current are collectively of sufficient amplitude to transfer the bubble 50 at the concurrently affected memory area 40 between the exposed first quadrant, representative of a stored 1, and the shielded third quadrant, representative of a stored 0.

After the bubble 50 in the one selected memory area has been positioned in the exposed quadrant 1 representative of a write 1 state or, alternatively, in the shielded quadrant 3 representative of a write 0 state, the bubble 50 along the one selected word line, e.g., 76-2 is unconditionally subjected to a full select current store signal via a store enable signal on line 65. The full select current store signal then positions or transfers the bubble 50 from the write 1 first quadrant to the stored 1 second quadrant while the bubble 50 is the write 0 third quadrant remains in the third quadrant, but is now defined as being in a stored 0 state. This write, store sequence completes the write operation - see FIGS. 10 and 11.

READ OPERATION

For a read operation, a full select current read signal, via the one addressed word line, e.g., 76-2, and a read enable signal on line 66, positions or transfers the bubble 50 from the stored 1 second quadrant to the read 1 first quadrant and from the stored 0 third quadrant to the read 0 fourth quadrant. At this time then, only the bubbles 50 along the one selected word line 76-2 are positioned in their read states with only the read 1 state with a bubble 50 in the exposed first quadrant permitting the beam incident thereto to be passed through analyzer 11, page composer 10 and plane polarizer 9 and thence via beam splitter 128 and cylindrical lens 123 to be focused upon the one-dimensional photosensor detector array 122 - see FIG. 1. After this optical read out of the data stored in the D memory areas 40 along the one selected word line 76-2 via detector 122, a full select current restore signal is, via a restore signal is, via a restore enable signal on line 67, coupled to the one selected word line 72-2 whereby the bubbles 50 in the read 1 state of quadrant 1 are transferred back into the stored 1 state of quadrant 2 or the bubbles 50 in the read 0 state of quadrant 4 are transferred back into the stored 0 state of quadrant 3. This read, restore cycle completes the read operation - see FIGS. 10 and 11.

OPERATION OF HOLOGRAPHIC MEMORY SYSTEM

The above described operation of page composer 10 will now be utilized to perform several functions within the holographic memory system of FIG. 1.

Compose Data for Storage in Storage Medium

For the use of page composer 10 as a means for writing data into storage medium 30, lasser generator 90 generates a coherent monochromatic light beam, such as a laser beam 92, that is directed along transmission axis 13 upon X, Y light deflector 94. Deflector 94 deflects beam 92 to a beam 96 along the X, Y axes for focusing the object beam 98 upon the desired one page 32a for storage medium 30 - see FIG. 5. Beam 96 next impinges upon beam splitter 100 a portion of which is deflected upon modulator 102 and another portion of which impinges upon mirror 104 and thence upon modulator 106.

For an initial write operation during which the information stored in page composer 10 is to be written into the storage medium 30 at the one selected page 32a, modulator 102 is switched in its ON state permitting beam 96a to pass therethrough while modulator 106 is switched in its OFF state preventing beam 96b from passing therethrough. Beam 96a, at beam splitter 108, is separated into a write reference beam 96c which, via mirror 110, is focused upon page 32a while the remaining portion of beam 96a passes through beam splitter 108 as beam 96d and via mirror 112 is focused upon holo-lens 114 functions to generate a plurality of, e.g., XY beamlets 118 from beam 96d, each separate beamlet being associated with, and focused upon the associated one of the XY memory areas in page composer 10. The XY beamlets 118 pass through plane polarizer 9 impinging upon page composer 10 with the individual beamlets 118 that correspond to the read 1's in the XY memory areas in page composer 10 passing through analyzer 11 forming object beam 98, which, via lens 120, is focused upon the one selected page 32a in storage medium 30 into which the information previously written into page composer 10 is to be recorded.

This information that has been previously written into page composer 10, preferably includes the writing of DW 1's or 0's in the DW memory areas 40 of page composer 10 in accordance with the above described write operation. Alternatively, only a selected one or one's of the W word lines may be utilized for the writing of data into storage medium 30. In any of the above conditions, none, one or more of all of the memory areas along the selected word line(s) are subjected to a read operation, as described above, so that the bubbles 50 in the selected memory areas 40 are transferred into their read 1 state of quadrant 1 or read 0 state of quadrant 4 such that only the real 1 state bubbles 50 permit the associated beamlets 118 to pass therethrough and to impinge upon storage medium 30 at the one selected page 32a. This concurrent effect of the write reference beam 96c and the object beam 98, containing the information generated or composed by page composer 10, stores in the one selected page 32a the data read out of page composer 10 and carried by object beam 98.

B. Read Out Data Stored in Storage Medium - Light Valve

For the use of page composer 10 as a means for reading out the data stored in storage medium 30, modulator 102 is switched OFF preventing beam 96a from passing therethrough while, conversely, modulator 106 is switched ON permitting read reference beam 96b, as deflected from mirror 104, to pass therethrough, and via mirrors 124 and 126, to cause beam 96b to be focused upon the one selected page 32a of storage medium 30. Read reference beam 96b upon page 32a causes the light that is reflected therefrom to be focused upon lens 120, to be passed through analyzer 11, page composer 10 and plane polarizer 9, to be reflected by beam splitter 128 and thence by means of cylindrical lens 123 to be focused upon one-dimensional photosensor array or detector 122.

Figure 12:
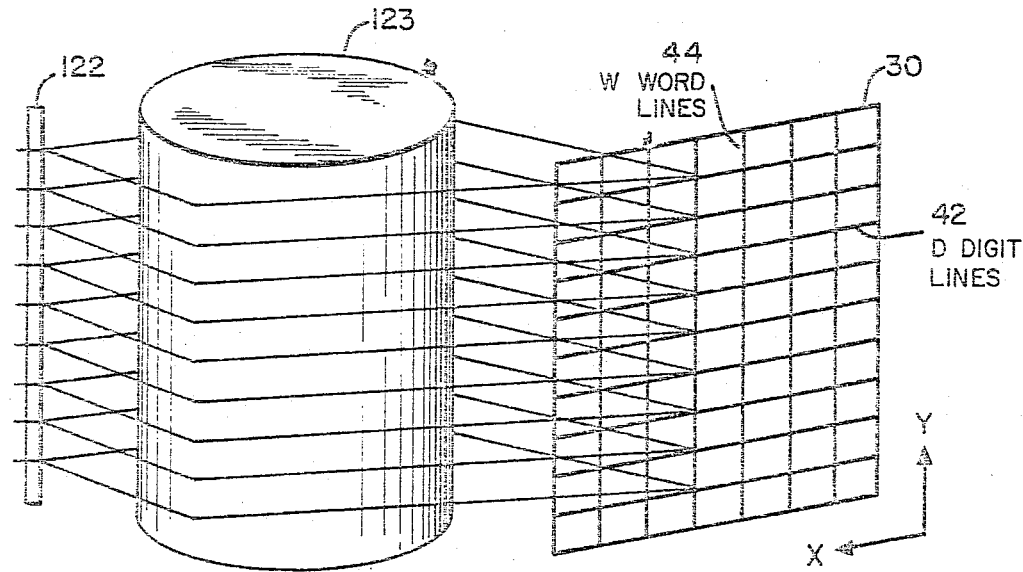
FIG. 12 is a conceptual schematic drawing illustrating the manner in which the one selected word line of the bubble memory system of FIG. 9 is optically read out by the one dimensional array of photosensors of FIG. 1.

Detector 122 is, as discussed above, a one-dimensional array of D photosensors, each of the D photosensors being associated with an associated one of the D memory areas 40 that lay along the one selected word line of page composer 10 - see FIG. 12. In this operation in which page composer 10 functions only as a light valve to pass only that data that is stored in page 32a that is associated with only a selected one of the W word line of page composer 10, only the D memory areas 40 along the selected one of the W word lines of page composer 10 are written with all bubbles 50 in the 1 state of quadrant 1 while all other memory areas 40, i.e., W(D/1), have their bubbles 50 in the stored 1 state of quadrant 2 or in the stored 0 state of quadrant 3 such that all memory areas 40 except those memory areas 40 that lay along the one selected word line block the passage of light therethrough. Thus, by using only a selected one of the W word lines, the D exposed bubbles 50 in the D associated memory areas 40 of page composer 10 are utilized to read out, by detector 122 the associated data previously stored in page 32a of storage medium 30.

C. Read Out Data Stored in Page Composer - Memory

For the read out of the information previously stored in page composer 10, X, Y light deflector 92 is caused to deflect beam 92 in an X, direction such that beam 130 will impinge upon mirror 134, e.g., positioned upon storage medium 30. For this operation, modulator 102 is switched OFF preventing beam 130 from passing therethrough while, conversely, modulator 106 is switched ON permitting read reference beam 130 as deflected from mirror 104, to pass therethrough and, via mirrors 124 and 126, to cause beam 130 to be focused upon mirror 134 upon storage medium 30. Read reference beam 130 upon impinging upon mirror 134 is uniformly reflected back, as read reference beam 132, upon lens 120 to be uniformly passed through and plane polarized by analyzer 11. Page composer 10 and plane polarizer 9 transmit only those beamlets associated with the read 1 state along the one selected word line, which beamlets are reflected by beam splitter 128 and thence by means of cylindrical lens 123 to be focused upon detector 122.

Detector 122, is, as discussed above, a one-dimensional array of D photosensors, each of the D photosensors being associated with an associated one of the D memory areas 40 that lay along the one selected word line of page composer 10 - see FIG. 12. In this operation, page composer 10 functions as a memory to pass only that data that is stored in page composer 10 and that is associated with only a selected one of the W word lines of page composer 10. Only the D memory areas 40 along the selected one of the W word lines for page composer 10 have their bubbles 50 positioned in the read 1 state of quadrant 1 or the read 0 state of quadrant 3, while all other memory areas 40, i.e., W (D-1), have their bubbles 50 in the stored 1 state of quadrant 2 or in the stored 0 state of quadrant 3 such that all memory areas 40 except that read 1 state of the memory areas 40 that lay along the one selected word line block the passage of light therethrough. Thus, by using only a selected one of the W word lines, only the exposed bubbles 50 in the D associated memory areas 40 along the one selected word line of page composer 10 are utilized to read out the associated data previously stored therein in the manner as described above.

What is claimed is:

1. In a page composer comprising a planar layer of magnetizable material in which single wall domains or bubbles may be sustained and moved about, D parallel conductive digit lines that are oriented parallel to the plane of said layer, W parallel conductive word lines that are oriented parallel to the plane of said layer and perpendicular to said parallel digit lines for forming DW memory areas, each memory area having four quadrants defined by the associated ones of said intersecting digit and word lines, and an opaque shield that is only oriented in the second, third and fourth quadrants of each of said DW memory areas for optically shielding a bubble except when in said first quadrant, the method of selectively moving the D bubbles that are associated with a selected one of said W word lines between said four quadrants, comprising:

selectively coupling a digit line half-select write current signal of a first or second and opposite polarity to said D digit lines;

selectively coupling a word line half-select write current signal of a first or second and opposite polarity to said selected one of said W word lines;

each of said digit line half-select write current signal and said word line half-select write current signal being individually of insufficient amplitude for substantially affecting the position of the bubble in the individually affected ones of D memory areas along the selected one of said W word lines, but collectively of sufficient amplitude for transferring said bubble between said first and said third quadrants in the collectively affected ones of said D memory areas;

selectively coupling a word line full-select store current signal of a first polarity to said selected one of said W word lines, said word line full-select store current signal being individually of sufficient amplitude for transferring the bubbles in the D memory areas along said one selected word line from a write 1 first quadrant and from a write 0 third quadrant to a store 1 second quadrant and to a store 0 third quadrant, respectively;

selectively coupling a word line full-select read current signal of the opposite second polarity as said word line full-select store current signal to said selected one of said W word lines, said word line full-select read current signal being of individually sufficient amplitude for transferring the bubbles in the D memory areas long said one selected word line from a store 1 second quadrant and from a store 0 third quadrant to a read 1 first quadrant and to a read 0 fourth quadrant, respectively; and, selectively coupling a word line full-select restore current signal of the same first polarity as said word line full-select store current signal to said selected one of said W word lines, said word line full-select store current signal being individually of sufficient amplitude for transferring the bubbles in the D memory areas along said one selected word line from a read 1 first quadrant and from a read 0 fourth quadrant to a store 1 second quadrant and a store 0 third quadrant, respectively.

2. In the method of claim 1:

forming a one dimensional photosensor array of only D photosensors;

focusing a coherent light beam normally incident to said layer and encompassing all of said DW memory areas;

focusing only the transmitted one of the D beamlets that are formed by said coherent light beam and the D memory areas that are oriented along said selected one of said W word lines and that have a bubble positioned in a read 1 first quadrant, upon the associated ones of said D photosensors for reading out the information that is stored in only the D memory areas that are oriented along said selected one of said W word lines.

3. A holographic memory system, comprising:

a page composer comprising a planar layer of magnetizable material in which single wall domains or bubbles may be sustained and moved about, D parallel conductive digit lines that are oriented parallel to the plane of said layer, W parallel conductive word lines that are oriented parallel to the plane of said layer and perpendicular to said parallel digit lines for forming DW memory areas, each memory area having four quadrants defined by the associated ones of said intersecting digit and word lines, and an opaque shield that is only oriented in the second, third and fourth quadrants of each of said DW memory areas for optically shielding a bubble except when in said first quadrant, and data composed in said page composer by selectively writing each of said DW memory areas into a 1 or a 0 by writing a bubble in said first quadrant or in said third quadrant;

a storage medium capable of storing XY pages of data, each page of which is separately composed in said page composer;

optical means for storing in said storage medium at a selected one of said XY pages a page of data that is composed in said page composer;

one-dimensional lens means;

one-dimensional detector means comprised of a linear array of D photosensor means;

control means coupling a digit line half-select write current signal to said D digit lines and a word line half-select write current signal to a selected one of said W word lines for positioning all the D bubbles in the memory areas along said one selected word line into said write 1 first quadrant; and, optical means including means for reading out data from a selected one of the W word lines of a selected one of the XY pages that are stored in said storage means and that corresponds to said selected one of the W word lines of said page composer and optically transmitting said read out data through all the D bubbles along said one selected word line that are all in said write 1 first quadrant and onto said one dimensional detector means.

* * * * *

UNITED STATES PATENT AND TRADEMARK OFFICE
CERTIFICATE OF CORRECTION

PATENT NO. : 4,040,039
DATED : August 2, 1977
INVENTOR(S) : Marlin M. Hanson, et al It is certified that error appears in the above-identified patent and that said Letters Patent are hereby corrected as shown below:

Column 10, Line 32, "long" should be -- along --.

Column 10, Line 44, "and a" should be -- and to a --.

Signed and Sealed this

Eighteenth Day of April 1978

[SEAL]

Attest:

RUTH C. MASON
Attesting Officer

LUTRELLE F. PARKER
Acting Commissioner of Patents and Trademarks